United States Patent [19]
Ueda

[11] Patent Number: 6,027,993
[45] Date of Patent: Feb. 22, 2000

[54] METHOD OF FORMING AN OPENING IN AN INSULATION FILM OVER A SEMICONDUCTOR SUBSTRATE

[75] Inventor: Yuu Ueda, Tokyo, Japan

[73] Assignee: NEC Corporation, Tokyo, Japan

[21] Appl. No.: 08/966,866

[22] Filed: Nov. 10, 1997

[30] Foreign Application Priority Data

Nov. 12, 1996 [JP] Japan ..................................... 8-300103

[51] Int. Cl.[7] ................................................. H01L 21/469
[52] U.S. Cl. .......................... 438/618; 438/618; 438/106; 438/107; 438/616
[58] Field of Search .................................... 438/618, 106, 438/107, 616, 641, 667, 678, 701

[56] References Cited

U.S. PATENT DOCUMENTS

4,337,115  6/1982  Ikeda et al. .............................. 438/618

*Primary Examiner*—David Nelms
*Assistant Examiner*—Pho Luu
*Attorney, Agent, or Firm*—Young & Thompson

[57] ABSTRACT

The present invention provides a method of forming an opening an insulation layer over a substrate. A photo-resist film with at least an opening is formed over a substrate. A first spacer layer is selectively formed within the opening of the photo-resist film. The photo-resist film is removed to have the first spacer layer remain over the substrate. An insulation layer is formed which extends over the first spacer layer and the substrate so that the insulation layer over the first spacer layer is higher in level than the insulation layer over the substrate. A second spacer layer is formed which extends over the insulation layer over the substrate so that the insulation layer over the first spacer layer is shown. Both the insulation layer over the first spacer layer and the second spacer layer are selectively removed so that the insulation layer over the substrate and the first spacer layer are shown. Only the first spacer layer is subjected to a wet etching to remove the first spacer layer without any substantive damage to the substrate and in place form an opening in the insulation layer, wherein the first spacer layer is made of a material which is higher in etching rate than an insulation material of the insulation layer.

34 Claims, 3 Drawing Sheets

000
METHOD OF FORMING AN OPENING IN AN INSULATION FILM OVER A SEMICONDUCTOR SUBSTRATE

BACKGROUND OF THE INVENTION

The present invention relates to a method of forming a semiconductor device, and more particularly to a method of forming an opening in an insulation film over a semiconductor substrate.

Formation of opening portions in insulation film over a semiconductor substrate is essential process for forming various semiconductor devices.

A typical one of the conventional methods of forming a semiconductor device will be described with reference to FIGS. 1A through 1E, which are fragmentary cross sectional elevation views illustrative of semiconductor devices in sequential steps involved in the conventional method of fabricating a bipolar transistor.

Figure 1A:
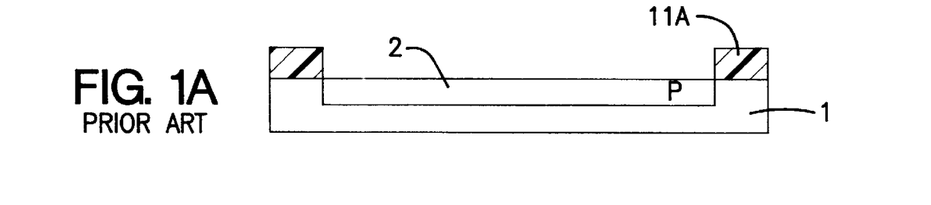
FIGS. 1A through 1E are fragmentary cross sectional elevation views illustrative of semiconductor devices in sequential steps involved in the conventional method of fabricating a bipolar transistor.

With reference to FIG. 1A, a photo-resist is applied onto a top surface of a silicon substrate 1 to form a photo-resist film 21A. An opening is formed in the photo-resist film 11A so that the opening is positioned over a base formation region of the silicon substrate 1 to form a photo-resist pattern 11A. The photo-resist pattern 11A is used as a mask for ion-implantation of a p-type impurity into the base formation region of the silicon substrate 1 whereby a p-type base region 2 is formed in the base formation region of the silicon substrate 1.

Figure 1B:
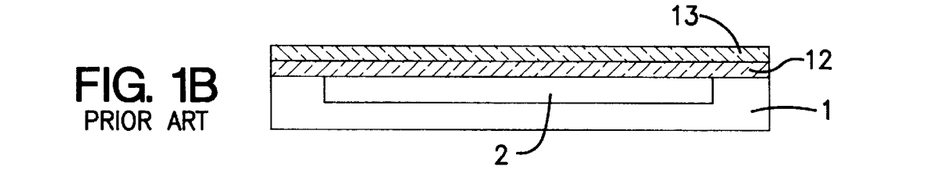

With reference to FIG. 1B, after the photo-resist film 11A has been removed, then a silicon dioxide film 12 is entirely grown over the top surfaces of the silicon substrate 1 and the p-type base region 2. Further, a silicon nitride film 13 is then entirely grown over the top surface of the silicon dioxide film 12 because the silicon nitride film 13 is hard and serves as a barrier layer against contamination of impurity.

Figure 1C:
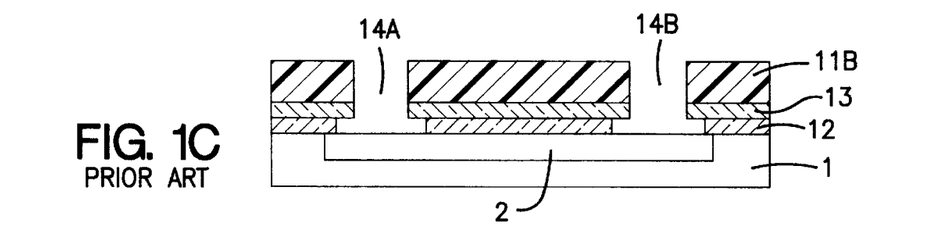

With reference to FIG. 1C, a photo-resist film 11B is provided over the top surface of the silicon nitride film 13. Opening portions are then formed in the photo-resist film 11B so that the opening portions are positioned over an emitter formation region and a base contact formation region in the p-type base region 2. The photo-resist film 11B is used as a mask for subsequent dry etching to the silicon nitride film 13 to form openings in the silicon nitride film 13. Subsequently, the silicon dioxide film 12 is subjected to a wet etching thereby to form openings 14A and 14B over the emitter formation region and the base contact formation region in the p-type base region 2. The wet etching is carried out to prevent the p-type base region 2 in the silicon substrate 1 from receipt of any damage. By contrast to the dry etching as an anisotropic etching, the wet etching is an isotropic etching, for which reason the silicon dioxide film 12 is subjected to a side etching namely etching is progressed not only in a vertical direction but also in a horizontal direction.

Figure 1D:
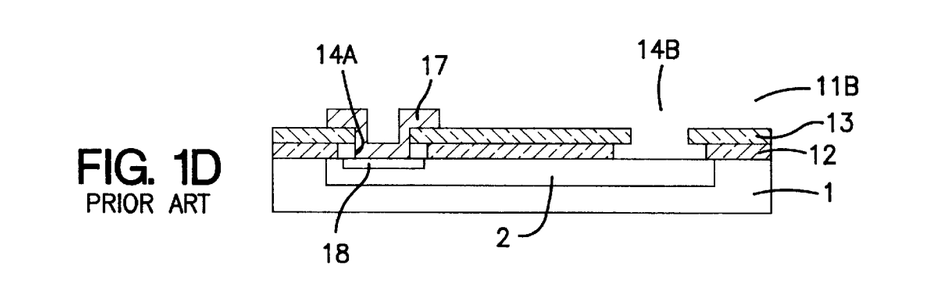

With reference to FIG. 1D, after the photo-resist film 11B has been removed, then a polysilicon film 17 is entirely grown over the silicon substrate so that the polysilicon film extends over the silicon nitride film 13 and the emitter formation region and the base contact formation region in the p-type base region 2 as well as in the openings 14A and 14B. An ion-implantation of an n-type impurity into the polysilicon film 17 is carried out to form an n-type impurity doped polysilicon film 17. A photo-resist film is further entirely provided over the impurity doped polysilicon film 17. An opening is then formed in the photo-resist film so that the opening is positioned over the emitter formation region.

The photo-resist film is used as a mask to selectively remove the n-type impurity doped polysilicon film 17 so that the n-type impurity doped polysilicon film 17 remains to extend over the emitter formation region of the p-type base region 2 of the opening 14A and within the opening 14A as well as extends on a part of the silicon nitride film 13 in the vicinity of the opening 14A. The photo-resist film has been removed, before the silicon substrate 1 is then subjected to a heat treatment to cause a thermal diffusion of the n-type impurity doped in the polysilicon film 17 into a shallow region of the emitter formation region of the p-type base region 2 whereby an n-type emitter region 18 is formed in the shallow region in the p-type base region 2.

Figure 1E:
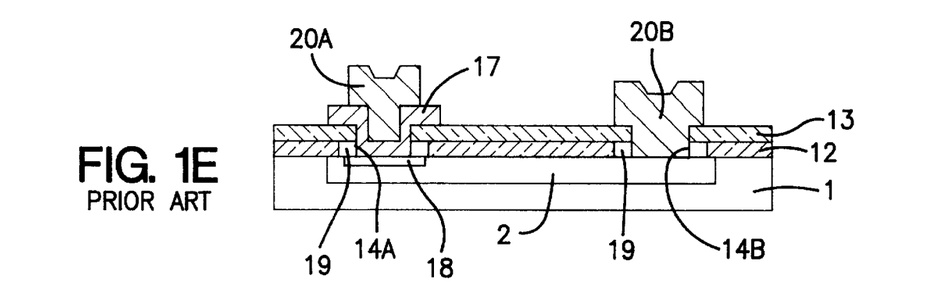

With reference to FIG. 1E, titanium and platinum films are entirely formed acting as conductive and barrier layers. A photo-resist film is moreover provided entirely and then openings are formed in the photo-resist so that the openings are positioned over the emitter formation region and the base contact formation region. The photo-resist film is then used as a mask for gold plating to selectively form a gold plating film 20A over the polysilicon film 17 as well as selectively form a gold plating film 20B in the opening 14B and over a part of the silicon nitride film 13 in the vicinity of the opening 14B. The gold plating films 20A and 20B serve as emitter and base electrodes. Unnecessary parts of the barrier layers are then removed.

It should, however, be noted that cavities 19 are formed between the polysilicon film 17 and the silicon dioxide film 12 as well as between the gold plating film 20B and the silicon dioxide film 12 because the silicon dioxide film 12 has been side-etched in the past wet etching. In a post cleaning process, moisture may enter into the cavities 19. As a result, expansion of a portion around the cavities 19 may appear or crack may be formed in the vicinity of the cavities 19. This results in the drop of reliability of the bipolar transistor.

If, however, in order to avoid the above first problem, the dry etching is, in place of the wet etching, carried out to form the openings 14A, then the surface of the p-type base region receives a certain damage by the dry etching.

The above conventional method of forming the bipolar transistor is engaged with the second problem as follows. As described above, titanium and platinum conductive and barrier layers are formed before the photo-resist film with openings as acting as the mask is formed on the barrier layers for subsequent formation of the gold-plating layer acting as the electrodes. Unnecessary parts of the barrier layers are then removed. If the barrier layer is required to be thick, this results in a required long time plating process whereby a probability of permeation of the plating solution into an interface between the barrier layer and the photo-resist film. As a result, the adhesion between the barrier layer and the photo-resist film becomes weak. The reliability of the electrode layer is thus dropped.

In the above circumstances, it had been required to develop a novel method of forming a semiconductor device free from the above first and second problems.

SUMMARY OF THE INVENTION

Accordingly, it is an object of the present invention to provide a novel method of forming a semiconductor device free from the above first and second problems.

It is a further object of the present invention to provide a novel method of forming an opening in a semiconductor device without any formation of cavity.

It is a still further object of the present invention to provide a novel method of forming an opening in a semiconductor device without any drop of reliability of the semiconductor device.

It is a further more object of the present invention to provide a novel method of forming a plating electrode layer in a semiconductor device without reduction in adhesion of a photo-resist film and the plating electrode layer.

It is moreover object of the present invention to provide a novel method of forming a plating electrode layer in a semiconductor device without any drop of reliability of the plating electrode layer.

The above and other objects, features and advantages of the present invention will be apparent from the following descriptions.

The present invention provides a method of forming an opening an insulation layer over a substrate. The method comprising the following steps. A photo-resist film with at least an opening is formed over a substrate. A first spacer layer is selectively formed within the opening of the photo-resist film. The photo-resist film is removed to have the first spacer layer remain over the substrate. An insulation layer is formed which extends over the first spacer layer and the substrate so that the insulation layer over the first spacer layer is higher in level than the insulation layer over the substrate. A second spacer layer is formed which extends over the insulation layer over the substrate so that the insulation layer over the first spacer layer is shown. Both the insulation layer over the first spacer layer and the second spacer layer are selectively removed so that the insulation layer over the substrate and the first spacer layer are shown. Only the first spacer layer is subjected to a wet etching to remove the first spacer layer without any substantive damage to the substrate and in place form an opening in the insulation layer, wherein the first spacer layer is made of a material which is higher in etching rate than an insulation material of the insulation layer.

BRIEF DESCRIPTION OF THE DRAWINGS

Preferred embodiments according to the present invention will be described with reference to the accompanying drawings.

DISCLOSURE OF THE INVENTION

The first present invention provides a method of forming an opening an insulation layer over a substrate. The method comprising the following steps. A photo-resist film with at least an opening is formed over a substrate. A first spacer layer is selectively formed within the opening of the photo-resist film. The photo-resist film is removed to have the first spacer layer remain over the substrate. An insulation layer is formed which extends over the first spacer layer and the substrate so that the insulation layer over the first spacer layer is higher in level than the insulation layer over the substrate. A second spacer layer is formed which extends over the insulation layer over the substrate so that the insulation layer over the first spacer layer is shown. Both the insulation layer over the first spacer layer and the second spacer layer are selectively removed so that the insulation layer over the substrate and the first spacer layer are shown. Only the first spacer layer is subjected to a wet etching to remove the first spacer layer without any substantive damage to the substrate and in place form an opening in the insulation layer, wherein the first spacer layer is made of a material which is higher in etching rate than an insulation material of the insulation layer. The first spacer layer may comprise a spin-on-glass layer. The first spacer layer may be formed by the steps of forming a spin-on-glass layer which extends over the photo-resist film and within the opening; and subjecting the spin-on-glass layer to an etching back so that the spin-on-glass layer remains only within the opening. The insulation layer may comprise a silicon nitride layer. The second spacer layer may comprise a spin-on-glass layer. The second spacer layer may be formed by the steps of forming a spin-on-glass layer which entirely extends over the silicon nitride layer which further extends over the spin-on-glass first spacer layer and the substrate, and subjecting the spin-on-glass layer to an etching back so that the spin-on-glass layer remains only over the silicon nitride layer over the substrate.

Further, there are made the steps of forming a metal barrier layer on the substrate before the photo-resist film is formed over the metal barrier layer, and after the opening has been formed in the insulation layer, selectively forming at least a metal plating layer within the opening of the insulation layer.

Also, there may be made the steps of removing the insulation layer and the metal barrier layer underlying the insulation layer so as to leave laminations of the metal barrier layer and the metal plating layer.

Also, there may be made the steps of the steps of, after the opening has been formed in the insulation layer, forming a metal barrier layer at least on the substrate shown through the opening, and selectively forming at least a metal plating layer on the metal barrier layer.

The substrate may comprise a semiconductor substrate. The semiconductor substrate may have an epitaxial region doped with a first impurity of a first conductivity type and the opening is positioned over the epitaxial region. There may further be made the steps of forming a polysilicon layer doped with a second impurity of a second conductivity type at least in the opening and over the epitaxial region; subjecting the substrate to a heat treatment to cause a thermal diffusion of the second impurity into the epitaxial region thereby to selectively form a second conductivity type impurity doped shallow region in an upper portion of the epitaxial region; selectively forming a metal barrier layer on the polysilicon layer; and selectively forming a metal plating layer on the metal barrier layer.

The second present invention provides a method of forming an opening an insulation layer over a substrate. A photo-resist film with at least an opening is formed over a substrate. A first spin-on-glass layer is selectively formed within the opening of the photo-resist film. The photo-resist film is removed to have the first spin-on-glass layer remain over the substrate. A silicon nitride layer is formed which extends over the first spin-on-glass layer and the substrate so that the silicon nitride layer over the first spin-on-glass layer is higher in level than the silicon nitride layer over the substrate. A second spin-on-glass layer is formed which extends over the silicon nitride layer over the substrate so that the silicon nitride layer over the first spin-on-glass layer is shown. Both the silicon nitride layer over the first spin-on-glass layer and the second spin-on-glass layer are selectively removed so that the silicon nitride layer over the substrate and the first spin-on-glass layer are shown. Only the first spin-on-glass layer is subjected to a wet etching to remove the first spin-on-glass layer without any substantive damage to the substrate and in place form an opening in the silicon nitride layer.

The third present invention provides a method of forming a semiconductor device. A photo-resist film with at least an opening is formed over a metal barrier layer on a substrate. A first spin-on-glass layer is selectively formed within the opening of the photo-resist film. The photo-resist film is removed to have the first spin-on-glass layer remain over the metal barrier layer. A silicon nitride layer is formed which extends over the first spin-on-glass layer and the metal barrier layer so that the silicon nitride layer over the first spin-on-glass layer is higher in level than the silicon nitride layer over the metal barrier layer. A second spin-on-glass layer is formed which extends over the silicon nitride layer over the metal barrier layer so that the silicon nitride layer over the first spin-on-glass layer is shown. Both the silicon nitride layer over the first spin-on-glass layer and the second spin-on-glass layer are selectively removed so that the silicon nitride layer over the metal barrier layer and the first spin-on-glass layer are shown. Only the first spin-on-glass layer is subjected to a wet etching to remove the first spin-on-glass layer without any substantive damage to the metal barrier layer and in place form an opening in the silicon nitride layer. At least a metal plating layer is selectively formed within the opening of the silicon nitride layer. The silicon nitride layer and the metal barrier layer underlying the silicon nitride layer are removed so as to leave laminations of the metal barrier layer and the metal plating layer.

The fourth present invention provides a method of forming a semiconductor device. A photo-resist film with at least an opening is formed over a substrate. A first spin-on-glass layer is selectively formed within the opening of the photo-resist film. The photo-resist film is removed to have the first spin-on-glass layer remain over the substrate. A silicon nitride layer is formed which extends over the first spin-on-glass layer and the substrate so that the silicon nitride layer over the first spin-on-glass layer is higher in level than the silicon nitride layer over the substrate. A second spin-on-glass layer is formed which extends over the silicon nitride layer over the substrate so that the silicon nitride layer over the first spin-on-glass layer is shown. Both the silicon nitride layer over the first spin-on-glass layer and the second spin-on-glass layer are selectively removed so that the silicon nitride layer over the substrate and the first spin-on-glass layer are shown. Only the first spin-on-glass layer is subjected to a wet etching to remove the first spin-on-glass layer without any substantive damage to the substrate and in place form an opening in the silicon nitride layer. A metal barrier layer is formed at least on the substrate shown through the opening. At least a metal plating layer is selectively formed on the metal barrier layer.

The fifth present invention provides a method of forming a semiconductor device. A photo-resist film with at least an opening is formed over a substrate having an epitaxial region doped with a first impurity of a first conductivity type so that the opening is positioned over the epitaxial region. A first spin-on-glass layer is selectively formed within the opening of the photo-resist film. The photo-resist film is removed to have the first spin-on-glass layer remain over the epitaxial region in the substrate. A silicon nitride layer is formed which extends over the first spin-on-glass layer, the epitaxial region and the substrate so that the silicon nitride layer over the first spin-on-glass layer is higher in level than the silicon nitride layer over the epitaxial region and the substrate. A second spin-on-glass layer is formed which extends over the silicon nitride layer over the epitaxial region and the substrate so that the silicon nitride layer over the first spin-on-glass layer is shown. Both the silicon nitride layer over the first spin-on-glass layer and the second spin-on-glass layer are selectively removed so that the silicon nitride layer over the epitaxial region, the substrate and the first spin-on-glass layer are shown. Only the first spin-on-glass layer is subjected to a wet etching to remove the first spin-on-glass layer without any substantive damage to the epitaxial region and the substrate and in place form an opening in the silicon nitride layer. A polysilicon layer doped with a second impurity of a second conductivity type is formed at least in the opening and over the epitaxial region. The substrate is subjected to a heat treatment to cause a thermal diffusion of the second impurity into the epitaxial region thereby to selectively form a second conductivity type impurity doped shallow region in an upper portion of the epitaxial region. A metal barrier layer is selectively formed on the polysilicon layer for selectively forming a metal plating layer on the metal barrier layer.

PREFERRED EMBODIMENTS

First Embodiment

A first embodiment in accordance with the present invention will be described with reference to FIGS. 2A through 2F, which are fragmentary cross sectional elevation views illustrative of semiconductor devices in sequential steps involved in a novel method of fabricating a bipolar transistor.

Figure 2A:
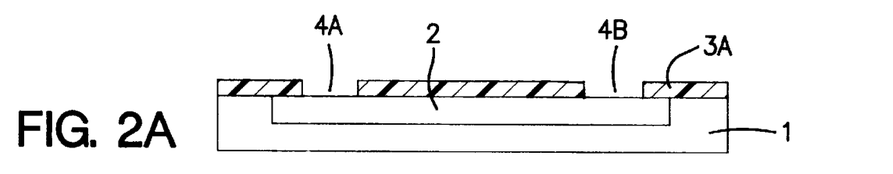
FIGS. 2A through 2F are fragmentary cross sectional elevation views illustrative of semiconductor devices in sequential steps involved in a novel method of fabricating a bipolar transistor in a first embodiment in accordance with the present invention.

With reference to FIG. 2A, a photo-resist is applied onto a top surface of a silicon substrate 1 to form a photo-resist film not illustrated. An opening is selectively formed in the photo-resist film so that the opening is positioned over a base formation region of the silicon substrate 1 to form a photo-resist pattern. The photo-resist pattern is used as a mask for ion-implantation of a p-type impurity into the base formation region of the silicon substrate 1 whereby a p-type base region 2 is formed in the base formation region of the silicon substrate 1. After the photo-resist film has been removed, then a photo-resist film 3A having a thickness in the range of 200–500 nanometers is entirely provided over the top surfaces of the silicon substrate 1 and the p-type base region 2. Further, openings 4A and 4B are then formed in the photo-resist film 3A by exposure and subsequent development thereof so that the openings 4A and 4B are respectively positioned over an emitter formation region and a base contact formation region in the p-type base region 2. The size of the openings 4A and 4B is in the range of 0.5–1.0 micrometer.

Figure 2B:
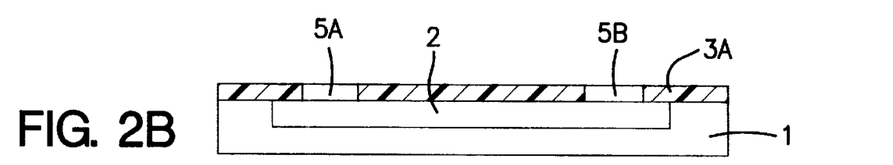

With reference to FIG. 2B, a spin-on-glass solution, which is an organic solution containing silicon, is entirely spin-coated for subsequent heat treatment at a temperature in the range of 300–400° C. thereby to entirely form a first spin-on-glass film 5A which extends over the photo-resist film 3A and within the openings 4A and 4B. As a result, the openings 4A and 4B are filled with the first spin-on-glass film 5A. Subsequently, a photo-resist film not illustrated is formed and then planarized, before an etch back is carried out using $CF_4$ gas and $O_2$ gas until the top surface of the photo-resist film 3A is shown, so that the first spin-on-glass films 5A remain only within the openings 4A and 4B in the photo-resist film 3A.

Figure 2C:
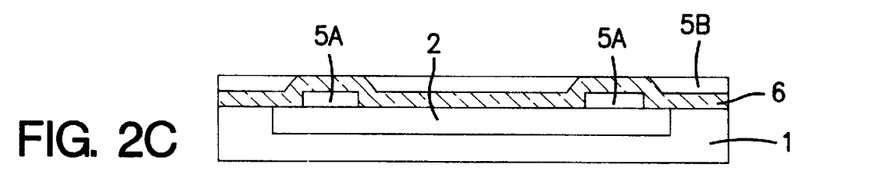

With reference to FIG. 2C, the photo-resist film 3A has been removed whilst only the first spin-on-glass films 5A remain over the top surfaces of the p-type base region 2 and the silicon substrate 1. Thereafter, a silicon nitride film 6 is entirely deposited by a chemical vapor deposition method so that the silicon nitride film 6 extends over the first spin-on-glass films 5A and the top surfaces of the p-type base region 2 and the silicon substrate 1. The silicon nitride film 6 has a thickness in the range of 200–600 nanometers. The upper surface of the silicon nitride film 6 over the first spin-on-glass films 5A is higher in level than that of the silicon nitride film 6 over the top surface of the p-type base region 2 and the silicon substrate 1. Namely, the upper surface of the silicon nitride film 6 has difference in level over position. Subsequently, a second spin-on-glass film 5B having a thickness in the range of 200–500 nanometers is then entirely formed over the silicon nitride film 6 and then planarized to form a flat top surface of the silicon nitride film 6 and the second spin-on-glass film 5B.

Figure 2D:
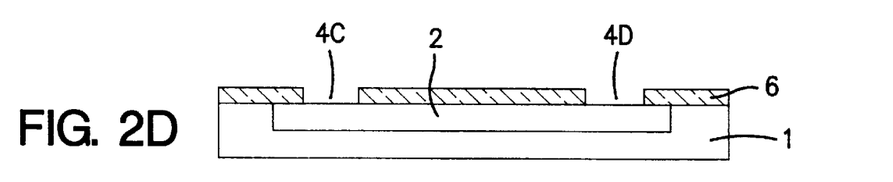

With reference to FIG. 2D, the second spin-on-glass film 5B and the silicon nitride film 6 over the first spin-on-glass films 5A are subjected to an etch-back using $CF_4$ gas and $O_2$ gas until the top surfaces of the first spin-on-glass films 5A and the surface of the silicon nitride film 6 over the p-type base region 2 and the silicon substrate 1 are shown. The first spin-on-glass films 5A are selectively etched using an HF system etchant to form openings 4C and 4D in the silicon nitride film 6 in place of the first spin-on-glass films 5A. As a result, the openings 4C and 4D are positioned over the emitter formation region and the base contact formation region in the p-type base region 2.

Figure 2E:
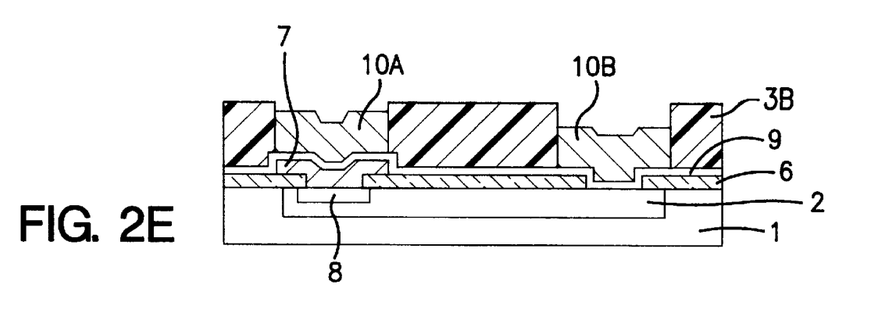

With reference to FIG. 2E, a polysilicon film 7 is entirely grown over the silicon substrate so that the polysilicon film 7 extends over the silicon nitride film 6 and the emitter formation region and the base contact formation region in the p-type base region 2 as well as in the openings 4C and 4D. An ion-implantation of an n-type impurity such as arsenic "As" into the polysilicon film 7 is carried out to form an n-type impurity doped polysilicon film 7. A photo-resist film is further entirely provided over the impurity doped polysilicon film 7. An opening is then formed in the photo-resist film by exposure and subsequent development so that the opening is positioned over the emitter formation region. The photo-resist film is used as a mask to selectively remove the n-type impurity doped polysilicon film 7 so that the n-type impurity doped polysilicon film 7 remains to extend over the emitter formation region of the p-type base region 2 of the opening 4C and within the opening 4C as well as extends on a part of the silicon nitride film 6 in the vicinity of the opening 4C. The photoresist film has been removed, before the silicon substrate 1 is then subjected to a heat treatment in nitrogen atmosphere to cause a thermal diffusion of the n-type impurity "As" doped in the polysilicon film 7 into a shallow region of the emitter formation region of the p-type base region 2 whereby an n-type emitter region 8 is formed in the shallow region in the p-type base region 2. A barrier layer 9 of titanium and platinum film laminations is entirely formed acting as conductive and barrier layers. A photo-resist film 3B is moreover provided entirely on the barrier layer and then openings are formed in the photo-resist 3B so that the openings are positioned over the emitter formation region and the base contact formation region. The photo-resist film 3B is then used as a mask for gold plating to selectively form a gold plating film 10A over the polysilicon film 7 as well as selectively form a gold plating film 10B in the opening 4D and over a part of the barrier layer 9 in the vicinity of the opening 4D. The gold plating films 10A and 10B serve as emitter and base electrodes respectively.

Figure 2F:
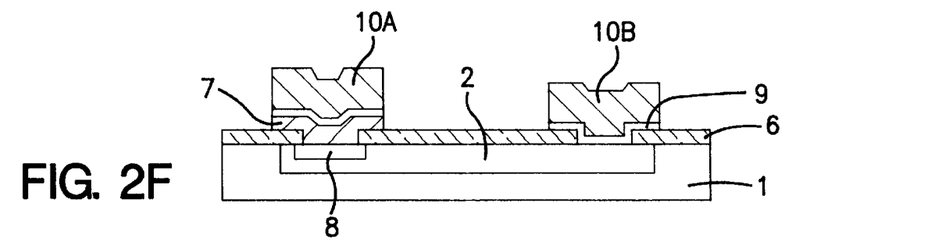

With reference to FIG. 2F, the photo-resist film 3B and unnecessary parts of the barrier layers under the photo-resist film 3B are then removed to form the emitter and base electrodes.

It should, however, be noted that no cavity is formed around the emitter and base electrodes. The above method makes the bipolar transistor free from the problem with entry of moisture in the bipolar transistor in a post-cleaning process. As a result, no expansion nor crack may be caused. This makes it possible to keep a high reliability of the bipolar transistor.

As described above, the p-type base region is not subjected to the dry etching, for which reason the p-type base region is free from any damage.

Second Embodiment

A second embodiment in accordance with the present invention will be described with reference to FIGS. 3A through 3E, which are fragmentary cross sectional elevation views illustrative of semiconductor devices in sequential steps involved in a novel method of fabricating electrode layers.

Figure 3A:
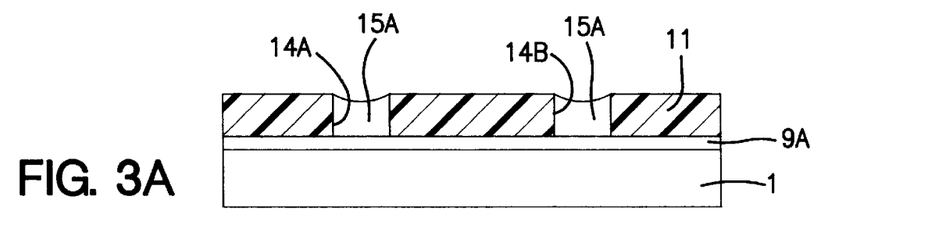
FIGS. 3A through 3E are fragmentary cross sectional elevation views illustrative of semiconductor devices in sequential steps involved in a novel method of fabricating electrode layers in a second embodiment in accordance with the present invention.

With reference to FIG. 3A, a barrier layer 9A of laminations of titanium and platinum films is entirely formed on a top surface of the substrate 1. A photo-resist is applied onto a top surface of the barrier layer 9A to form a photo-resist film 11 having a thickness in the range of 1–2 micrometers entirely over the top surfaces of the barrier layer 9A. Further, openings 14A and 14B are then formed in the photo-resist film 11 by exposure and subsequent development thereof so that the openings 14A and 14B are respectively positioned over predetermined electrode layer formation regions. A spin-on-glass solution, which is an organic solution containing silicon, is entirely spin-coated for subsequent heat treatment at a temperature in the range of 300–400° C. thereby to entirely form a first spin-on-glass film which extends over the photo-resist film 11 and within the openings 14A and 14B. As a result, the openings 14A and 14B are filled with the first spin-on-glass film. Subsequently, an etch back is carried out using $CF_4$ gas and $O_2$ gas until the top surface of the photo-resist film 11 is shown, so that the first spin-on-glass films 15A remain only within the openings 14A and 14B in the photo-resist film 11.

Figure 3B:
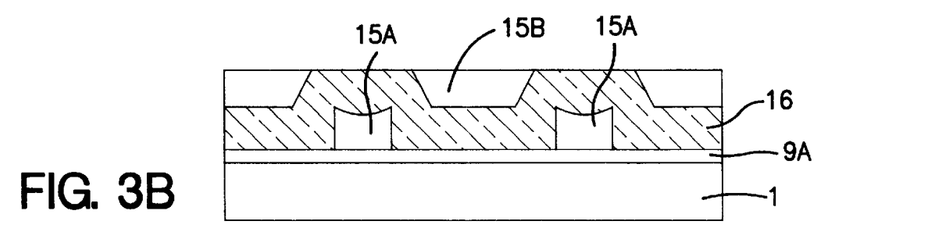

With reference to FIG. 3B, the photo-resist film 11 has been removed whilst only the first spin-on-glass films 15A remain over the top surface of the barrier layer 9A. Thereafter, a silicon nitride film 16 is entirely deposited by a chemical vapor deposition method so that the silicon nitride film 16 extends over the first spin-on-glass films 15A and the top surface of the barrier layer 9A. The silicon nitride film 16 has a thickness in the range of 1–2 micrometers. The upper surface of the silicon nitride film 16 over the first spin-on-glass films 15A is higher in level than that of the silicon nitride film 16 over the top surface of the barrier layer 9A. Namely, the upper surface of the silicon nitride film 16 has difference in level over position. Subsequently, a second spin-on-glass film 15B having a thickness in the range of 1–2 micrometers is then entirely formed over the silicon nitride film 16 and then planarized to form a flat top surface of the silicon nitride film 16 and the second spin-on-glass film 15B.

Figure 3C:
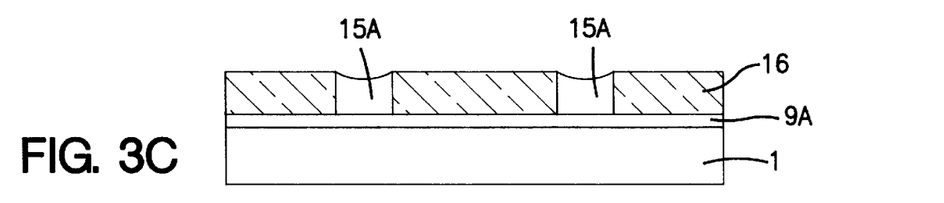

With reference to FIG. 3C, the second spin-on-glass film 15B and the silicon nitride film 16 over the first spin-on-glass films 15A are subjected to an etch-back using $CF_4$ gas and $O_2$ gas until the top surfaces of the first spin-on-glass films 15A and the surface of the silicon nitride film 6 over the barrier layer 9A are shown.

Figure 3D:
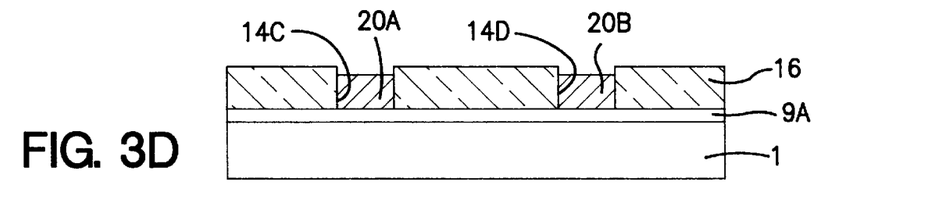

With reference to FIG. 3D, the first spin-on-glass films 15A are selectively etched using an HF system etchant to form openings 14C and 14D in the silicon nitride film 16 in place of the first spin-on-glass films 5A. As a result, the openings 14C and 14D are positioned over the electrode layer formation regions. The silicon nitride film 16 with the openings 14C and 14D is then used as a mask for gold plating to selectively form gold plating films 20A and 20B over the electrode layer formation regions. The gold plating films 20A and 20B serve as electrodes respectively.

Figure 3E:
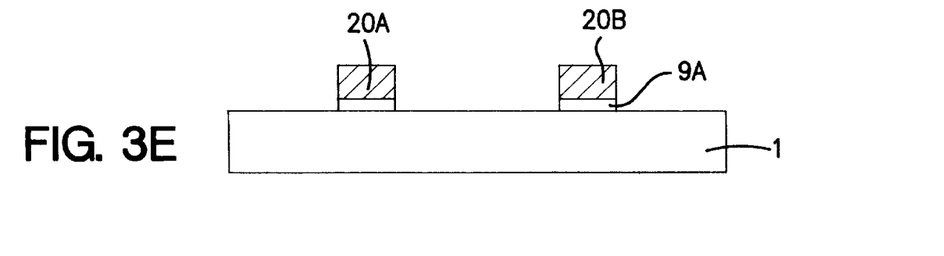

With reference to FIG. 3E, the silicon nitride film 16 and unnecessary parts of the barrier layer 9A under the silicon nitride film 16 are then removed to form the electrodes.

As described above, the plating is carried out by using the silicon nitride film 16 as a mask, for which reason the silicon nitride film 16 is capable of preventing any permeation of the plating solution into an interface between the barrier layer 9A and the silicon nitride film 16. As a result, the adhesion between the barrier layer 9A and the silicon nitride film 16 remains unchanged. A high reliability of the electrode layer is thus obtained.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claim is:

1. A method of forming an opening an insulation layer over a substrate, said method comprising the steps of:
    forming a photo-resist film with at least an opening over a substrate;
    selectively forming a first spacer layer within said opening of said photo-resist film;
    removing said photo-resist film to have said first spacer layer remain over said substrate;
    forming an insulation layer which extends over said first spacer layer and said substrate so that said insulation layer over said first spacer layer is higher in level than said insulation layer over said substrate;
    forming a second spacer layer which extends over said insulation layer over said substrate so that said insulation layer over said first spacer layer is shown;
    selectively removing both said insulation layer over said first spacer layer and said second spacer layer so that said insulation layer over said substrate and said first spacer layer are shown; and
    subjecting only said first spacer layer to a wet etching to remove said first spacer layer without any substantive damage to said substrate and in place form an opening in said insulation layer,
    wherein said first spacer layer is made of a material which is higher in etching rate than an insulation material of said insulation layer.

2. The method as claimed in claim 1, wherein said first spacer layer comprises a spin-on-glass layer.

3. The method as claimed in claim 2, wherein said first spacer layer is formed by the steps of:
    forming a spin-on-glass layer which extends over said photo-resist film and within said opening; and
    subjecting said spin-on-glass layer to an etching back so that said spin-on-glass layer remains only within said opening.

4. The method as claimed in claim 2, wherein said insulation layer comprises a silicon nitride layer.

5. The method as claimed in claim 4, wherein said second spacer layer comprises a spin-on-glass layer.

6. The method as claimed in claim 5, wherein said second spacer layer is formed by the steps of:
    forming a spin-on-glass layer which entirely extends over said silicon nitride layer which further extends over said spin-on-glass first spacer layer and said substrate; and
    subjecting said spin-on-glass layer to an etching back so that said spin-on-glass layer remains only over said silicon nitride layer over said substrate.

7. The method as claimed in claim 1, further comprising the steps of:
    forming a metal barrier layer on said substrate before said photo-resist film is formed over said metal barrier layer; and
    after said opening has been formed in said insulation layer, selectively forming at least a metal plating layer within said opening of said insulation layer.

8. The method as claimed in claim 7, further comprising step of:
    removing said insulation layer and said metal barrier layer underlying said insulation layer so as to leave laminations of said metal barrier layer and said metal plating layer.

9. The method as claimed in claim 1, further comprising the steps of:
    after said opening has been formed in said insulation layer, forming a metal barrier layer at least on said substrate shown through said opening; and
    selectively forming at least a metal plating layer on said metal barrier layer.

10. The method as claimed in claim 1, wherein said substrate comprises a semiconductor substrate.

11. The method as claimed in claim 1, wherein said semiconductor substrate has an epitaxial region doped with a first impurity of a first conductivity type and said opening is positioned over said epitaxial region.

12. The method as claimed in claim 11, further comprising the steps of:
    forming a polysilicon layer doped with a second impurity of a second conductivity type at least in said opening and over said epitaxial region;
    subjecting said substrate to a heat treatment to cause a thermal diffusion of said second impurity into said epitaxial region thereby to selectively form a second conductivity type impurity doped shallow region in an upper portion of said epitaxial region;
    selectively forming a metal barrier layer on said polysilicon layer; and
    selectively forming a metal plating layer on said metal barrier layer.

13. A method of forming an opening an insulation layer over a substrate, said method comprising the steps of:
    forming a photo-resist film with at least an opening over a substrate;
    selectively forming a first spin-on-glass layer within said opening of said photo-resist film;
    removing said photo-resist film to have said first spin-on-glass layer remain over said substrate;
    forming a silicon nitride layer which extends over said first spin-on-glass layer and said substrate so that said silicon nitride layer over said first spin-on-glass layer is higher in level than said silicon nitride layer over said substrate;

forming a second spin-on-glass layer which extends over said silicon nitride layer over said substrate so that said silicon nitride layer over said first spin-on-glass layer is shown;

selectively removing both said silicon nitride layer over said first spin-on-glass layer and said second spin-on-glass layer so that said silicon nitride layer over said substrate and said first spin-on-glass layer are shown; and subjecting only said first spin-on-glass layer to a wet etching to remove said first spin-on-glass layer without any substantive damage to said substrate and in place form an opening in said silicon nitride layer.

14. The method as claimed in claim 13, wherein said first spin-on-glass layer is formed by the steps of:

forming a spin-on-glass layer which extends over said photo-resist film and within said opening; and subjecting said spin-on-glass layer to an etching back so that said spin-on-glass layer remains only within said opening.

15. The method as claimed in claim 14, wherein said second spin-on-glass layer is formed by the steps of:

forming a spin-on-glass layer which entirely extends over said silicon nitride layer which further extends over said spin-on-glass first spacer layer and said substrate; and subjecting said spin-on-glass layer to an etching back so that said spin-on-glass layer remains only over said silicon nitride layer over said substrate.

16. The method as claimed in claim 13, further comprising the steps of:

forming a metal barrier layer on said substrate before said photo-resist film is formed over said metal barrier layer; and after said opening has been formed in said silicon nitride layer, selectively forming at least a metal plating layer within said opening of said silicon nitride layer.

17. The method as claimed in claim 16, further comprising step of:

removing said silicon nitride layer and said metal barrier layer underlying said silicon nitride layer so as to leave laminations of said metal barrier layer and said metal plating layer.

18. The method as claimed in claim 13, further comprising the steps of:

after said opening has been formed in said silicon nitride layer, forming a metal barrier layer at least on said substrate shown through said opening; and selectively forming at least a metal plating layer on said metal barrier layer.

19. The method as claimed in claim 13, wherein said substrate comprises a semiconductor substrate.

20. The method as claimed in claim 13, wherein said semiconductor substrate has an epitaxial region doped with a first impurity of a first conductivity type and said opening is positioned over said epitaxial region.

21. The method as claimed in claim 20, further comprising the steps of:

forming a polysilicon layer doped with a second impurity of a second conductivity type at least in said opening and over said epitaxial region;

subjecting said substrate to a heat treatment to cause a thermal diffusion of said second impurity into said epitaxial region thereby to selectively form a second conductivity type impurity doped shallow region in an upper portion of said epitaxial region;

selectively forming a metal barrier layer on said polysilicon layer; and selectively forming a metal plating layer on said metal barrier layer.

22. A method of forming a semiconductor device, said method comprising the steps of:

forming a photo-resist film with at least an opening over a metal barrier layer on a substrate; selectively forming a first spin-on-glass layer within said opening of said photo-resist film;

removing said photo-resist film to have said first spin-on-glass layer remain over said metal barrier layer;

forming a silicon nitride layer which extends over said first spin-on-glass layer and said metal barrier layer so that said silicon nitride layer over said first spin-on-glass layer is higher in level than said silicon nitride layer over said metal barrier layer;

forming a second spin-on-glass layer which extends over said silicon nitride layer over said metal barrier layer so that said silicon nitride layer over said first spin-on-glass layer is shown;

selectively removing both said silicon nitride layer over said first spin-on-glass layer and said second spin-on-glass layer so that said silicon nitride layer over said metal barrier layer and said first spin-on-glass layer are shown;

subjecting only said first spin-on-glass layer to a wet etching to remove said first spin-on-glass layer without any substantive damage to said metal barrier layer and in place form an opening in said silicon nitride layer;

selectively forming at least a metal plating layer within said opening of said silicon nitride layer; and removing said silicon nitride layer and said metal barrier layer underlying said silicon nitride layer so as to leave laminations of said metal barrier layer and said metal plating layer.

23. The method as claimed in claim 22, wherein said first spin-on-glass layer is formed by the steps of:

forming a spin-on-glass layer which extends over said photo-resist film and within said opening; and subjecting said spin-on-glass layer to an etching back so that said spin-on-glass layer remains only within said opening.

24. The method as claimed in claim 23, wherein said second spin-on-glass layer is formed by the steps of:

forming a spin-on-glass layer which entirely extends over said silicon nitride layer which further extends over said spin-on-glass first spacer layer and said substrate; and subjecting said spin-on-glass layer to an etching back so that said spin-on-glass layer remains only over said silicon nitride layer over said substrate.

25. The method as claimed in claim 22, wherein said substrate comprises a semiconductor substrate.

26. A method of forming a semiconductor device, said method comprising the steps of:

forming a photo-resist film with at least an opening over a substrate;

selectively forming a first spin-on-glass layer within said opening of said photo-resist film;

removing said photo-resist film to have said first spin-on-glass layer remain over said substrate forming a silicon nitride layer which extends over said first spin-on-glass layer and said substrate so that said silicon nitride layer over said first spin-on-glass layer is higher in level than said silicon nitride layer over said substrate;

forming a second spin-on-glass layer which extends over said silicon nitride layer over said substrate so that said silicon nitride layer over said first spin-on-glass layer is shown;

selectively removing both said silicon nitride layer over said first spin-on-glass layer and said second spin-on-glass layer so that said silicon nitride layer over said substrate and said first spin-on-glass layer are shown;

subjecting only said first spin-on-glass layer to a wet etching to remove said first spin-on-glass layer without any substantive damage to said substrate and in place form an opening in said silicon nitride layer;

forming a metal barrier layer at least on said substrate shown through said opening; and selectively forming at least a metal plating layer on said metal barrier layer.

27. The method as claimed in claim 26, wherein said first spin-on-glass layer is formed by the steps of:

forming a spin-on-glass layer which extends over said photo-resist film and within said opening; and subjecting said spin-on-glass layer to an etching back so that said spin-on-glass layer remains only within said opening.

28. The method as claimed in claim 27, wherein said second spin-on-glass layer is formed by the steps of:

forming a spin-on-glass layer which entirely extends over said silicon nitride layer which further extends over said spin-on-glass first spacer layer and said substrate; and subjecting said spin-on-glass layer to an etching back so that said spin-on-glass layer remains only over said silicon nitride layer over said substrate.

29. The method as claimed in claim 26, wherein said substrate comprises a semiconductor substrate.

30. The method as claim 26, wherein said semiconductor substrate has an epitaxial region doped with a first impurity of a first conductivity type and said opening is positioned over said epitaxial region.

31. A method of forming a semiconductor device, said method comprising the steps of:

forming a photo-resist film with at least an opening over a substrate having an epitaxial region doped with a first impurity of a first conductivity type so that said opening is positioned over said epitaxial region;

selectively forming a first spin-on-glass layer within said opening of said photo-resist film;

removing said photo-resist film to have said first spin-on-glass layer remain over said epitaxial region in said substrate;

forming a silicon nitride layer which extends over said first spin-on-glass layer, said epitaxial region and said substrate so that said silicon nitride layer over said first spin-on-glass layer is higher in level than said silicon nitride layer over said epitaxial region and said substrate;

forming a second spin-on-glass layer which extends over said silicon nitride layer over said epitaxial region and said substrate so that said silicon nitride layer over said first spin-on-glass layer is shown;

selectively removing both said silicon nitride layer over said first spin-on-glass layer and said second spin-on-glass layer so that said silicon nitride layer over said epitaxial region, said substrate and said first spin-on-glass layer are shown;

subjecting only said first spin-on-glass layer to a wet etching to remove said first spin-on-glass layer without any substantive damage to said epitaxial region and said substrate and in place form an opening in said silicon nitride layer;

forming a polysilicon layer doped with a second impurity of a second conductivity type at least in said opening and over said epitaxial region;

subjecting said substrate to a heat treatment to cause a thermal diffusion of said second impurity into said epitaxial region thereby to selectively form a second conductivity type impurity doped shallow region in an upper portion of said epitaxial region;

selectively forming a metal barrier layer on said polysilicon layer; and selectively forming a metal plating layer on said metal barrier layer.

32. The method as claimed in claim 31, wherein said first spin-on-glass layer is formed by the steps of:

forming a spin-on-glass layer which extends over said photo-resist film and within said opening; and subjecting said spin-on-glass layer to an etching back so that said spin-on-glass layer remains only within said opening.

33. The method as claimed in claim 32, wherein said second spin-on-glass layer is formed by the steps of:

forming a spin-on-glass layer which entirely extends over said silicon nitride layer which further extends said spin-on-glass first spacer layer and said substrate; and subjecting said spin-on-glass layer to an etching back so that said spin-on-glass layer remains only over said silicon nitride layer over said substrate.

34. The method as claimed in claim 32, wherein said substrate comprises a semiconductor substrate.

* * * * *